United States Patent [19]

Yoshida et al.

[11] Patent Number: 5,760,725
[45] Date of Patent: Jun. 2, 1998

[54] CURRENT CELL TYPE DIGITAL-ANALOG CONVERTER

[75] Inventors: Sinya Yoshida; Toyohisa Matsukawa, both of Chiba, Japan

[73] Assignee: Kawasaki Steel Corporation, Hyogo, Japan

[21] Appl. No.: 622,152

[22] Filed: Mar. 27, 1996

[30] Foreign Application Priority Data

Mar. 29, 1995 [JP] Japan .................. 7-071441

[51] Int. Cl.$^6$ .................................................. H03M 1/66
[52] U.S. Cl. .................................................. 341/144
[58] Field of Search .......................... 341/144, 148, 341/118

[56] References Cited

U.S. PATENT DOCUMENTS

| | | | |
|---|---|---|---|
| 5,057,838 | 10/1991 | Tsuji et al. | 341/133 |
| 5,164,725 | 11/1992 | Long | 341/118 |
| 5,541,598 | 7/1996 | Malek-Khosravi | 341/118 |

FOREIGN PATENT DOCUMENTS

| | | |
|---|---|---|
| A-1-115223 | 5/1989 | Japan . |
| 04162830 | 6/1992 | Japan . |
| A-4-262622 | 9/1992 | Japan . |

Primary Examiner—Brian K. Young
Attorney, Agent, or Firm—Oliff & Berridge, PLC

[57] ABSTRACT

A current cell type digital-analog (DA) converter is situated in the end portion of a semiconductor chip and adapted to outputting an analog signal having resolution corresponding to the number of bits of an input digital signal. The current cell type DA converter is provided with a decoder for decoding the digital signal and outputting the decoded signal, and a current cell block in which a plurality of current cells corresponding to the resolution of the analog signal are arranged in a row and each of the current cells is controlled by the decoded signal. The centrally-positioned current cell out of those arranged in a row is turned on when the digital signal is odd-numbered and turned off when it is even-numbered. With the centrally-positioned current cell as the central element, current cell pairs disposed on both symmetrical sides of the centrally-positioned current cell are simultaneously turned on or off on a current cell pair basis according to the digital signal.

22 Claims, 12 Drawing Sheets

FIG. 2

| cell number | current characteristic | 1 | 2 | 3 | 4 | 5 | 6 | 7 |
|---|---|---|---|---|---|---|---|---|
| 1 | +3 | | | | | | ○ | ○ |
| 2 | +2 | | | | ○ | ○ | ○ | ○ |
| 3 | +1 | | ○ | ○ | ○ | ○ | ○ | ○ |
| 4 | ±0 | ○ | | ○ | | ○ | | ○ |
| 5 | −1 | | ○ | ○ | ○ | ○ | ○ | |
| 6 | −2 | | | | ○ | ○ | ○ | ○ |
| 7 | −3 | | | | | | ○ | ○ | total of current characteristics  ±0 ±0 ±0 ±0 ±0 ±0 ±0

FIG. 6

| | |
|---|---|
| | R7 +10 (+9) |
| | G7 +9 (+9) |
| | B7 +8 (+9) |
| | R6 +7 (+6) |
| | G6 +6 (+6) |
| | B6 +5 (+6) |
| | R5 +4 (+3) |
| | G5 +3 (+3) |
| R4a +1 (±0) | B5 +2 (+3) |
| G4a +0.5 (±0) | |
| | B4 ±0 (±0) |
| G4b −0.5 (±0) | |
| R4b −1 (±0) | B3 −2 (−3) |
| | G3 −3 (−3) |
| | R3 −4 (−3) |
| | B2 −5 (−6) |
| | G2 −6 (−6) |
| | R2 −7 (−6) |
| | B1 −8 (−9) |
| | G1 −9 (−9) |
| | R1 −10 (−9) |

FIG. 5

| | | | | | | | | | | | | | | | | |
|---|---|---|---|---|---|---|---|---|---|---|---|---|---|---|---|---|
|L7| | | | | |S7| | | | | | | | | |L7|
|L6| | | | | |S6| | | | | | | | | |L6|
|L5| | | | | |S5| | | | | | | | | |L5|
|L4| | | | | |S4| | | | | | | | | |L4|
|L3| | | | | |S3| | | | | | | | | |L3|
|L2| | | | | |S2| | | | | | | | | |L2|
|L1| | | | | |S1| | | | | | | | | |L1|
|L0| | | | | |S0| | | | | | | | | |L0|
|L1| | | | | |S1| | | | | | | | | |L1|
|L2| | | | | |S2| | | | | | | | | |L2|
|L3| | | | | |S3| | | | | | | | | |L3|
|L4| | | | | |S4| | | | | | | | | |L4|
|L5| | | | | |S5| | | | | | | | | |L5|
|L6| | | | | |S6| | | | | | | | | |L6|
|L7| | | | | |S7| | | | | | | | | |L7|

Prior Art

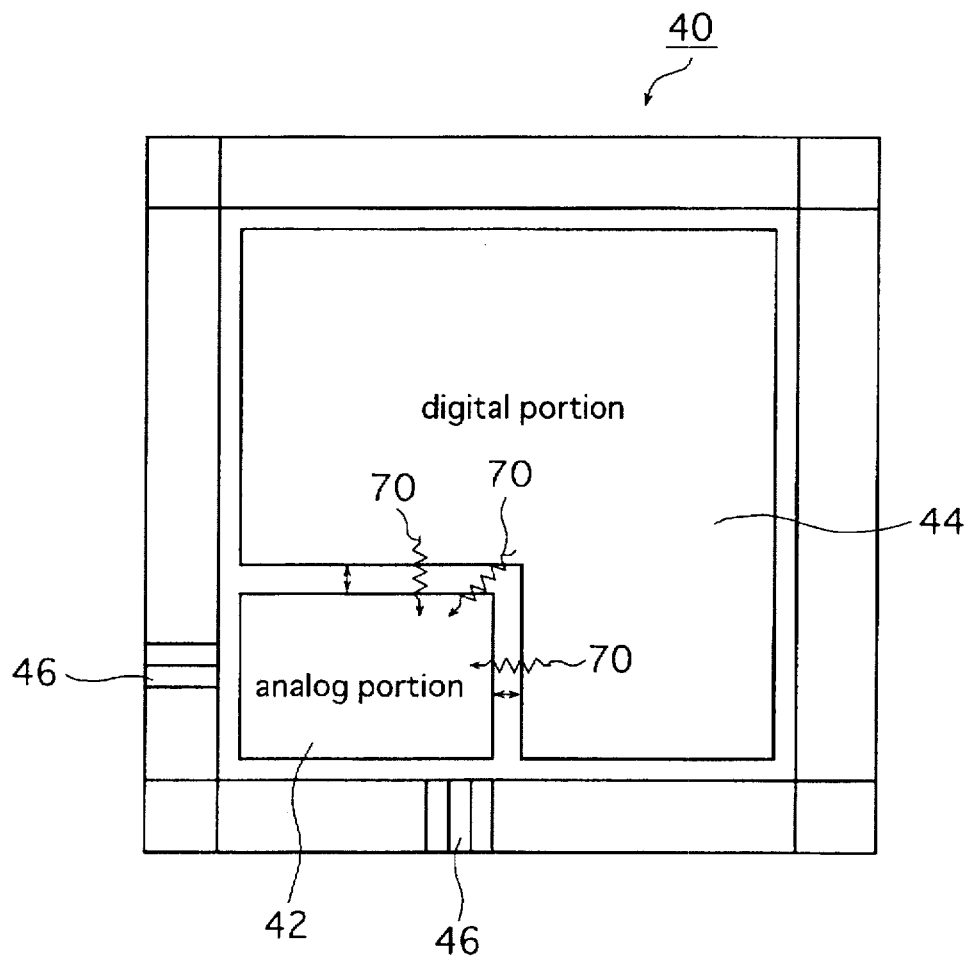

FIG.13a

| cell number | order |
|---|---|
| 1 | 7 |
| 2 | 6 |
| 3 | 5 |
| 4 | 4 |
| 5 | 3 |
| 6 | 2 |
| 7 | 1 |

FIG.13b

| cell number | order |
|---|---|
| 1 | 6 |
| 2 | 4 |
| 3 | 2 |
| 4 | 1 |
| 5 | 3 |
| 6 | 5 |
| 7 | 7 |

FIG.13c

| cell number | order |
|---|---|
| 1 | 3 |
| 2 | 1 |
| 3 | 7 |
| 4 | 5 |
| 5 | 4 |
| 6 | 2 |
| 7 | 6 |

FIG.14a

| cell number | current characteristic | 1 | 2 | 3 | 4 | 5 | 6 | 7 |
|---|---|---|---|---|---|---|---|---|
| 1 | +3 | | | | | | | ○ |
| 2 | +2 | | | | | | ○ | ○ |
| 3 | +1 | | | | | ○ | ○ | ○ |
| 4 | ±0 | | | | ○ | ○ | ○ | ○ |
| 5 | −1 | | | ○ | ○ | ○ | ○ | ○ |
| 6 | −2 | | ○ | ○ | ○ | ○ | ○ | ○ |
| 7 | −3 | ○ | ○ | ○ | ○ | ○ | ○ | ○ |
| total of current characteristics | | −3 | −5 | −6 | −6 | −5 | −3 | ±0 |

FIG.14b

| cell number | current characteristic | 1 | 2 | 3 | 4 | 5 | 6 | 7 |
|---|---|---|---|---|---|---|---|---|
| 1 | +3 | | | | | | ○ | ○ |
| 2 | +2 | | | | ○ | ○ | ○ | ○ |
| 3 | +1 | | ○ | ○ | ○ | ○ | ○ | ○ |
| 4 | ±0 | ○ | ○ | ○ | ○ | ○ | ○ | ○ |
| 5 | −1 | | | ○ | ○ | ○ | ○ | ○ |
| 6 | −2 | | | | | ○ | ○ | ○ |
| 7 | −3 | | | | | | | ○ |
| total of current characteristics | | ±0 | +1 | ±0 | +2 | ±0 | +3 | ±0 |

FIG.14c

| cell number | current characteristic | 1 | 2 | 3 | 4 | 5 | 6 | 7 |
|---|---|---|---|---|---|---|---|---|
| 1 | +3 | | | ○ | ○ | ○ | ○ | ○ |
| 2 | +2 | ○ | ○ | ○ | ○ | ○ | ○ | ○ |
| 3 | +1 | | | | | | | ○ |
| 4 | ±0 | | | | | ○ | ○ | ○ |
| 5 | −1 | | | | ○ | ○ | ○ | |
| 6 | −2 | | ○ | ○ | ○ | ○ | ○ | ○ |
| 7 | −3 | | | | | | ○ | ○ |
| total of current characteristics | | +2 | ±0 | +3 | +2 | +2 | −1 | ±0 |

FIG.15

| R7 +4 (+3) | G7 +3 (+3) | B7 +2 (+3) |
|---|---|---|
| R6 +3 (+2) | G6 +2 (+2) | B6 +1 (+2) |
| R5 +2 (+1) | G5 +1 (+1) | B5 ±0 (+1) |
| R4 +1 (±0) | G4 ±0 (±0) | B4 -1 (±0) |
| R3 ±0 (-1) | G3 -1 (-1) | B3 -2 (-1) |
| R2 -1 (-2) | G2 -2 (-2) | B2 -3 (-2) |
| R1 -2 (-3) | G1 -3 (-3) | B1 -4 (-3) |

CURRENT CELL TYPE DIGITAL-ANALOG CONVERTER

BACKGROUND OF THE INVENTION

The present invention relates to current cell type digital-analog (hereinafter called "DA") converters and more particularly to a current cell type DA converter which is adapted to canceling sloping variations in output current characteristics so as to improve their linearity.

Current cell type DA converters (digital-analog converters) are apparatus for converting digital signals to analog signals and, like AD converters (analog-digital converters), widely used in digital audio equipment, video equipment, communications equipment and also in the fields of instrumentation, control and the like.

The current cell type DA converter is particularly characterized by an extremely high conversion rate because it is capable of expressing an analog value by means of electric current and often employed in the image signal processing field. Generally, signals of three colors RGB (red, green and blue) constitute an image signal, which often renders a typical DA converter to be inclusive of three channels (3ch) correspondingly. Thus a macro cell is often adopted into such a 3ch-DA converter.

FIG. 9 shows an example of a conventional current cell type DA converter. This current cell type DA converter 30 has a decoder 12 for decoding a digital signal and outputting the decoded signal, and a current cell block 14 in which a plurality of current cells 32 corresponding to the resolution of a digital signal are arranged in a matrix form. Incidentally, the resolution of the analog signal is determined by the number of bits of the digital signal and expressed by the LSB (Least Significant Bit). When a digital signal having n bits is converted to an analog signal, for example, the resolution of the analog signal makes $2^n$ LSB.

FIG. 10($a$) shows an example of a conventional current cell. This current cell 32$a$ has three P-type MOS transistors (hereinafter called the "PMOS") 18, 20, 22. The source of the PMOS 18 is connected to a power supply and the drain thereof to the sources of the PMOSs 20, 22, whereas constant voltage is applied to the gate thereof, so that the PMOS 18 acts as a constant current source which operates in the saturation area. Moreover, the drain of the PMOS 20 is connected to the ground and the gate thereof to a decode signal line 24. Further, the drain of the PMOS 22 is connected to an output signal line (IOUT) 28 and the gate thereof to an inverted decode signal line 26.

In the current cell 32$a$, the PMOSs 20, 22 operate as switches and when the decoded signal is at a high level, the constant current flows toward the output, whereas when it is at a low level, it flows toward the ground.

In the current cell 32$a$ shown in FIG. 10($a$) by way of example, further, the constant voltage is supplied to the gate of the PMOS 22 instead of connecting the inverted code signal line 26 thereto in some cases. In the above case, the advantage is that switching noise is reducible.

FIG. 10($b$) shows another example of the current cell. This current cell 32$b$ has two PMOSs 18, 20 connected in series. In this case, the source of the PMOS 20 is connected to the power supply and the gate thereof to the decode signal line 24. Moreover, the source of the PMOS 18 is connected to the output signal line 28, whereas the constant voltage is applied to the gate thereof, so that the PMOS 18 acts as a constant current source which operates in the saturation area.

In the current cell 32$b$, unlike the current cell 32$a$ into which the constant current is caused to flow at all times, the current is supplied to the output signal line 28 only when the current cell 32$b$ is held ON. Therefore, the advantage is that the inverted decode signal line 26 and the PMOS 22 can be dispensed with in the current cell 32$b$ in contrast to the current cell 32$a$.

In the current cell 32$b$ shown in FIG. 10($b$) by way of example, further, the PMOSs 18, 20 are positioned conversely in some cases. Although the current cells 32$a$ and 32$b$ as shown in FIGS. 10($a$) and ($b$), respectively, have been defined as those formed with the PMOSs, the current cells are not limited to these cases, and the current cells 32$c$ and 32$d$ as shown in FIGS. 10($c$) and ($d$), respectively, may be formed with N-type MOS transistors (NMOS) 19, 21 and 23 as occasion demands.

All the current cells 32 (32$a$, 32$b$, 32$c$ and 32$d$) are arranged so that they are connected in parallel to the output signal line 28 in the current cell type DA converter 30.

Subsequently, the operation of the current cell type DA converter 30 will be described.

When an n-bit digital signal is supplied to the decoder 12 in the current cell type DA converter 30, the digital signal is decoded and ($2^n-1$) digital signals are output accordingly. Of these digital signals, the same number of decoded signals as the values (digital codes) of the digital signals become active. In a case where a 3-bit digital signal whose digital code is 100 (binary number) is input, for example, 7 (=$2^3-1$) decoded signals obtainable by decoding the input signal are output and of the 7 decoded signals, four decoded signals become active.

Then these decoded signals are supplied to the current cell block 14. When the active, that is, the high-level decoded signals are supplied to the current cell 32$a$ shown in FIG. 10($a$), the PMOSs 20, 22 are turned off and on, respectively. Therefore, the constant current I (equivalent to 1 LSB) of the PMOS 18 flows via the PMOS 22 toward the output signal line 28.

When the inactive, that is, the low-level decoded signals are supplied to the current cell 32, the PMOSs 20, 22 are turned on and off, respectively. Therefore, the constant current I of the PMOS 18 flows via the PMOS 20 toward the ground.

In the current cell block 14, only the current cell 32 corresponding to the active decoded signal is thus turned on and the total current output from the all the current cells 32 in the ON state is supplied to the output signal line 28. The current is converted by a terminating resistor (though not shown) into what has a predetermined voltage level and output as an analog signal having a voltage level corresponding to the digital code thus supplied.

More specifically, the current cell type DA converter 30 supplies a predetermined current, that is, the current equivalent to 1 LSB, to the output signal line 28 each time one current cell 32 is turned on, whereby it outputs an analog signal having a voltage level corresponding to the digital signal supplied. Consequently, current cells 32 similar to each other are used, so that the same quantity of current is output from each current cell 32; in other words, it is needless to say essential that the characteristics of the currents that are output from the respective current cells 32 are equalized. Further, special care should be taken in arranging current cells 32 and cell-to-cell wiring.

Notwithstanding, semiconductor devices are susceptible to lacking uniformity because of errors in formation which are caused by, for example, density distribution at the step of diffusion accompanying heat treatment and the distortion of lenses of exposure apparatus during the process of manufacture. Further, there is a case where a typical semiconductor chip may produce an invisible warp or become twisted, for example, due to stress at the time it is sealed with plastics. Generally, MOS products tend to cause variations in the performance of internal transistors under the influence of stress strain. In the case of a relatively small chip, it is a common practice to dispose transistors in need of relative precision in the central portion rather than the corner portion of each side; that is, an ideal portion is one which is centrally positioned.

Incidentally, the provision of a predetermined space is needed between an analog and a digital portion in order to avoid mutual noise interference when the analog and digital portions are mixedly loaded on a large semiconductor chip.

When the analog portion is placed in the central portion of the semiconductor chip, however, it will become necessary to provide such a space around the analog portion with respect to the digital portion and the problem is that the layout area tends to increase.

In a case where such analog and digital portions are mixedly loaded on a semiconductor chip, an analog portion 42 is therefore placed in the corner of a semiconductor chip 40 as shown in FIG. 11, so that the space provided between the analog portion 42 and a digital portion 44 is wide enough to set them free from the interference of noise 70.

When the analog portion 42 is placed in the end portion, preferably a corner portion of the semiconductor chip 40, the layout area required to secure the space between the analog portion and the digital portion 44 is curtailed and this is advantageous in that the analog portion can be wired into output pads 46 at a distance as short as possible.

However, stress is concentrated in this portion. The larger the semiconductor chip becomes, the greater the stress grows. Therefore, the MOS product mixedly loaded with the analog and digital portions and sealed with plastics is unavoidably affected by the stress. Moreover, the distribution of heat originating from self-generated heat of the semiconductor chip in operation causes variations in the operating characteristics at the element level.

Hence, there arise variations in the output current characteristics between, for example, the current cells 32, the variations therein appearing in a sloping, angular or trough-like shape or in a combination of these shapes. Consequently, the problem in this case is that the currents which are output from the respective current cells 32 tend to become differentiated in quantity. The variations induced at the exposure and diffusion steps are generally evaluated beforehand and used to determined the size of constant-current transistors as current cells. In other words, the gate length is selected so that it is great enough in size to absorb the aforementioned variations to a certain extent.

In a case where the current cell block is positioned in the end portion of the semiconductor chip, for example, the variations would always become sloped provided variations in the output current characteristics between the current cells arranged in a row are to occur. As shown in FIG. 12, for example, given that the output current characteristics of a central current cell 4 out of the seven current cells 1, 2, 3, 4, 5, 6 and 7 which are arranged in a row and constitute a current cell block are ±0, the current cells 1, 2 and 3 disposed on one side have sloping plus output current characteristics and the plus output current characteristic of the endmost current cell 1 is maximized. Whereas the current cells 5, 6 and 7 disposed on the other side have sloping minus output current characteristics and the minus output current characteristic of the endmost current cell 7 is maximized.

Taking a case where a 3-bit digital signal is converted to an analog signal at 8 LSB resolution by way of example, there will subsequently be given a further detailed description of problems arising from the above case. In order to gain analog signals having voltage levels ranging from 0 to 7, seven current cells 1, 2, 3, 4, 5, 6 and 7 are necessitated and the description will be given on the assumption that sloping variations exist among these current cells 1–7.

FIGS. 13(a), (b) and (c) are exemplary diagrams showing the order in which the current cells are turned on sequentially from one to the other side (or from the other to one side), the order in which the current cells are turned on alternately from the central portion to both end portions (or both end portions to the central portion) and the order in which the current cells are sequentially turned on at random. The method shown in FIG. 13(b) refers to what was disclosed in Unexamined Patent Publication (Kokai) 1-115223 in connection with a digital-analog converter.

FIGS. 14(a), (b) and (c) are characteristic diagrams illustrating the results of the study at the time the current cells are turned on in the order designated in FIGS. 13(a), (b) and (c), respectively. In FIGS. 14(a), (b) and (c), the current cells in the ON state are marked with ○. In all the cases of FIGS. 14(a), (b) and (c), moreover, whole current cell 1–7 is held OFF with a digital code of 0 and naturally the sum total of output current characteristics is ±0.

First, as shown in FIGS. 13(a) and 14(a), the total of output current characteristics makes −3 since the current cell 7 is turned on when the digital code is 1 in a case where the current cells 7, 6, 5, 4, 3, 2 and 1 are turned on while the digital codes are 1, 2, 3, 4, 5, 6 and 7, respectively. Likewise, the total of output current characteristics makes −5, −6, −6, −5, −3 and ±0 while the digital codes are 2, 3, 4, 5, 6 and 7, respectively.

When the current cells 1–7 are successively turned on from one to the other side in this way, the total of output current characteristics makes ±0 when the digital code is 7 but it is seen to become biased toward the minus side at any time other than this. When, moreover, the current cells 1–7 are successively turned on from the other to one side, though not shown, the total of output current characteristics makes ±0 when the digital code is 7 but it is also seen to become biased toward the plus side at any time other than this.

Next, as shown in FIG. 13(b) and FIG. 14(b), the current cell 4 is turned on when the digital code is 1 and therefore the total of output current characteristics makes ±0 in a case where the current cells 4, 3, 5, 2, 6, 1 and 7 are turned on while the digital codes are 1, 2, 3, 4, 5, 6 and 7, respectively. Likewise, the total of output current characteristics makes +1, ±0, +2, ±0, +3 and ±0 while the digital codes are 2, 3, 4, 5, 6 and 7, respectively.

When the current cells 1–7 are alternately turned on from the central portion to both end portions, the total of output current characteristics makes ±0 when the digital codes are 1, 3, 5 and 7 but it is seen to become biased toward the plus side when the digital codes are 2, 4 and 6. When, moreover, the current cells 1–7 are alternately turned on from both end portions to the central portion, though not shown, the total of output current characteristics makes ±0 when the digital codes are 2, 4, 6 and 7 but it is also seen to become biased toward the minus while the digital codes are 1, 3 and 5.

Next, as shown in FIG. 13(c) and FIG. 14(c), the current cell 2 is turned on when the digital code is 1 and therefore the total of output current characteristics makes ±2 in a case where the current cells 2, 6, 1, 5, 4, 7 and 3 are turned on while the digital codes are 1, 2, 3, 4, 5, 6 and 7, respectively.

Likewise, the total of output current characteristics makes ±0, +3, +2, +2, −1 and ±0 while the digital codes are 2, 3, 4, 5, 6 and 7, respectively.

When the current cells 1–7 are turned on at random, the total of output current characteristics makes ±0 when the digital codes are 2 and 7 in this way but it is seen to become biased at random toward the plus or minus side at any time other than this.

Consequently, the problem in this case is that in the presence of variations in the output current characteristics of the respective current cells 1–7, the output linearity of the output current characteristics of the current cell type DA converter deteriorates depending on the order in which the current cells 1–7 are turned on, so its accuracy worsens.

In order to solve the foregoing problems, a description will subsequently be given of a D/A converter disclosed in Unexamined Patent Publication (Kokai) 4-262622 by comparison with the current cell type DA converter 30 shown in FIGS. 9 and 10(a)–(d).

The D/A converter disclosed in that Patent Publication comprises a current converter unit equivalent to the aforementioned current cell block 14 and a switching means equivalent to the decoder 12. In this case, the current converter unit includes a plurality (i×n) of control elements equivalent to the current cells 32 and the control elements are divided into n blocks with i pieces of them as one block. Further, these control elements are such that those having current values in vertical symmetrical positions with respect to the mean current exhibiting variations in the whole output current characteristic are selected each on block and commonly connected so as to form each of i pieces of outputs. Further, the switching means controls the connection between these i pieces of outputs and output terminals in accordance with the digital quantity.

With such a D/A converter, control elements n times greater in number than before are provided and divided into n blocks. Further, the control elements having current values in vertical symmetrical positions with respect to the mean current exhibiting variations in the whole output current characteristic are selected on each block and commonly connected to form each of i pieces of outputs, whereby the sum of output current quantities at i pieces of outputs is equalized at each output. Thus an error in each output of the current converter unit due to variations in the current quantity with respect to the position of the control element is canceled, and the effect of improving the linearity is possible.

In comparison with a D/A converter arranged at equal resolution according to the prior art, however, the above D/A converter needs control elements n times greater in number than before. In order to form control elements n times greater in number than before, there still exists a problem arising from an increase in the layout area because the layout area will not remain the same even though the size of each control element is reduced. When the number of control elements is increased n times, moreover, element-to-element wiring becomes complicated. For this reason, the layout tends to become difficult and the operating speed is reduced because of wiring resistance and parasitic capacitance. In addition to the above problems, the disadvantage is that the output current characteristics are conversely caused to vary.

A description will subsequently be given of a DA converter which has a plurality of channels and is reduced to macro cells. The output current characteristics of a 3ch-DA converter for use in processing image signals, for example, is such that cell-to-cell variations in the output current characteristics are produced in the DA converter in an individual channel and sloping variations in the output current characteristics are also produced between the DA converters in the respective channels.

In the 3ch-DA converter shown in FIG. 15, for example, DA converters having the output current characteristics shown in FIG. 12 are disposed in the order of R, G, B colors from the left as shown therein and reduced to macro cells. In FIG. 15, variations in the output current characteristics between the DA converters in the respective channels are displayed on a current cell basis and similarly variation in the output current characteristics between the current cells in the DA converter in the individual channel are displayed in parentheses on a current cell basis.

In this 3ch-DA converter, the DA converter of R color placed to the left of the DA converter of G color has positive output current characteristics on the assumption that the centrally-positioned DA converter of G color has ±0 output current characteristics. Conversely, the DA converter of B color placed on the right has negative output current characteristics with respect to the DA converter of G color. Alternatively, the DA converters of R color and B color have opposite output current characteristics.

Moreover, the sum of the output current characteristics of the DA converters of R, G, B colors makes +7, ±0, −7 at full scale voltage, so that variations in the output current characteristics are maximized.

Since the DA converter which has the plurality of channels and is thus reduced to macro cells has variations in the output current characteristics between the DA converters in the respective channels, it still poses a problem in that the display screen is slightly tinged with red in the aforementioned 3ch-DA converter, for example.

SUMMARY OF THE INVENTION

An object of the present invention made in consideration of the problems raised in the aforementioned prior art is to provide a current cell type DA converter capable of improving the linearity of output current characteristics by controlling the order in which current cells are turned on and off so as to cancel sloping variations in the output current characteristics even in either case of a single channel or multiple channels.

In order to attain the above-described object, the present invention provides a current cell type digital-analog converter which is situated in an end portion of a semiconductor chip and adapted to outputting an analog signal having resolution corresponding to the number of bits of an input digital signal, the current cell type digital-analog converter comprising: a decoder for decoding the digital signal and outputting a decoded signal, and a current cell block in which a plurality of current cells corresponding to the resolution of the analog signal are arranged in a row and each of the current cells is controlled by the decoded signal, wherein the centrally-positioned current cell out of those arranged in a row is turned on when the digital signal is odd-numbered and turned off when it is even-numbered; with the centrally-positioned current cell as the central element, current cell pairs disposed on both symmetrical sides of the centrally-positioned current cell are simultaneously turned on or off on a current cell pair basis according to the digital signal.

Preferably, the current cell has a constant-current source for driving a predetermined current, and a first and a second switching element for switching the predetermined current driven by the constant-current source to an output terminal or the ground so as to output the predetermined current, wherein the control terminals of the first and second switching elements are exclusively controlled in accordance with the value of the digital signal.

Preferably, the current cell type digital-analog converter further comprises a latch for holding a signal supplied to the control terminals of the first and second switching elements.

Preferably, the current cell type digital-analog converter further comprises at least two adjusting current cells for regulating the quantity of current driven by the current cell.

Preferably, the centrally-positioned current cell out of those arranged in a row is directly controlled by the decoded signal using one bit within the digital signal; and with the centrally-positioned current cell as the central element, the current cell pairs disposed on both symmetrical sides of the centrally-positioned current cell are simultaneously controlled on a current cell pair basis by the decoded signal which is output from the decoder.

Preferably, the decoder is divided into two: a high order bit decoder for decoding the high order bits of the digital signal and outputting a high order decoded signal, and a low order bit decoder for decoding the low order bits of the digital signal and outputting a low order decoded signal; and the current cell block is divided into two: a high order bit current cell block in which high order bit current cells for driving the current corresponding to the high order bit are arranged in a row, and a low order bit current cell block in which low order bit current cells for driving the current corresponding to the low order bit are arranged in a row.

Preferably, the low order bit current cell block is placed in the center of the high order bit current cell block.

The present invention provides a current cell type digital-analog converter which is situated in an end portion of a semiconductor chip and has a plurality of channels each of which is used for outputting an analog signal having resolution corresponding to the number of bits of an input digital signal, the current cell type digital-analog converter comprising: a decoder for decoding the digital signal so as to output a decoded signal on a channel basis, and a current cell block in which a plurality of current cells having desired driving capability corresponding to the resolution of the analog signal in each channel are arranged in a row or rows with respect to the plurality of channels and arranged symmetrically with respect to the centrally-positioned current cell, the current cell in each channel being controlled by the decoded signal in each channel, wherein with respect to one channel out of the plurality of channels, one of the current cells arranged in a row or rows is centrally positioned, the remaining current cells being arranged symmetrically with respect to the centrally-positioned current cell; with respect to the remaining channels, two current cells as a pair of current cells having half the driving capability of the centrally-positioned current cell are arranged symmetrically about the centrally-positioned current cell, and the remaining cells having the same driving capability as that of the centrally-positioned current cell are arranged symmetrically about the centrally-positioned current cell and the pair of centrally-positioned current cells in each channel and wherein with respect to each of the whole plurality of channels, the centrally-positioned current cell out of those arranged in a row or rows or the pair of centrally-positioned current cells are turned on when the digital signal is odd-numbered and turned off when the digital signal is even-numbered; with the centrally-positioned current cell as the central element and with the pair of centrally-positioned current cells as the central elements, current cell pairs arranged on both symmetrical sides outside the centrally-positioned current cell or the pair of centrally-positioned current cells are simultaneously turned on or off according to the digital signal on the basis of the current cells thus symmetrically arranged.

Preferably, with respect to each channel, the pair of centrally-positioned current cells are arranged in linear symmetry about the centrally-positioned current cell.

Preferably, each of the pair of centrally-positioned current cells has the same width as that of the centrally-positioned current cell and half the height thereof.

Preferably, each of the pair of centrally-positioned current cells has the same number of transistors as that of those constituting the centrally-positioned current cell, whereas the size of such a transistor is halved.

Preferably, each of the pair of centrally-positioned current cells is formed of a plurality of current cell pieces, which are arranged in linear symmetry about the centrally-positioned current cell.

Preferably, the pair of centrally-positioned current cells are, with respect of each channel, arranged in point symmetry about the center of the centrally-positioned current cell.

Preferably, the centrally-positioned current cell and each of the current cell pair thus symmetrically arranged have the same height as that of each of the pair of centrally-positioned current cells and have width twice as large as each of the pair of centrally-positioned current cells.

Preferably, each of the pair of centrally-positioned current cells is formed of a plurality of current cell pieces, which are arranged in point symmetry about the center of the centrally-positioned current cell.

Preferably, the current cell has a constant-current source for driving a predetermined current, and a first and a second switching element for switching the predetermined current driven by the constant-current source to an output terminal or the ground so as to output the predetermined current, wherein the control terminals of the first and second switching elements are exclusively controlled in accordance with the value of the digital signal.

Preferably, the current cell type digital-analog converter further comprises a latch for holding a signal supplied to the control terminals of the first and second switching elements.

Preferably, the current cell type digital-analog converter further comprises at least two adjusting current cells for regulating the quantity of current driven by the current cell.

Preferably, the centrally-positioned current cell and the pair of centrally-positioned current cells in each channel are directly controlled by the decoded signal using one bit within the digital signal in the corresponding channel; and the centrally-positioned current cell or the current cell pairs disposed on both symmetrical sides outside the pair of the centrally-positioned current cells are simultaneously controlled on the basis of the current cell pair thus symmetrically arranged by the decoded signal which is output from the decoder.

Preferably, the decoder is divided into two: a high order bit decoder for decoding the high order bits of the digital signal and outputting a high order decoded signal, and a low order bit decoder for decoding the low order bits of the digital signal and outputting a low order decoded signal; and the current cell block is divided into two: a high order bit current cell block in which high order bit current cells for driving the current corresponding to the high order bit are arranged in a row or rows, and a low order bit current cell block in which low order bit current cells for driving the current corresponding to the low order bit are arranged in a row or rows.

Preferably, the low order bit current cell block is placed in the center of the high order bit current cell block.

A current cell type DA converter according to the present invention is placed in the end portion (peripheral portion) of a relatively large semiconductor chip, preferably in the corner portion thereof as one functional block for use therein. For this reason, the current cell type DA converter according to the present invention necessarily exhibits sloping variations in output current characteristics when the current cell type DA converter has variations in the output current characteristics.

When the present invention is applied to a multi-channel DA converter, the current cells of the DA converter of an individual channel are disposed in symmetrical positions on both sides of the centrally positioned current cell, respectively.

In the current cell type DA converter according to the present invention, the current cell centrally positioned out of those arranged in a row is so controlled that it is turned on when a digital signal is odd-numbered and conversely it is turned off when the digital signal is even-numbered. Further, a pair of current cells disposed symmetrically on both sides of the centrally positioned current cell are so controlled that they are turned on or off, depending on the value of the digital signal.

In other words, on the assumption that the output current characteristic of the centrally positioned current cell out of those arranged in a row is ±0, the current cells symmetrically positioned on both sides thereof have the output current characteristics equivalent to the plus and minus sides respectively since the current cell type DA converter according to the present invention necessarily has variations in sloping output current characteristics. Therefore, the pair of current cells symmetrically positioned are so controlled that they are simultaneously turned on or off, whereby the output current characteristics of these current cells are offset. Thus the output current characteristics can always be set to ±0.

With the current cell type DA converter according to the present invention, not only the linearity of the output current characteristics but also their precision is improvable since the output current characteristics can always be set to ±0 in either case where a DA converter has a single or multi-channel by placing the current cell type DA converter in the end portion of the semiconductor chip and controlling the ON/OFF state of the individual current cell so as to offset variations in the output current characteristics. Moreover, precision equal to what is given in the prior art can be compensated for from the standpoint of circuitry even with the provision of constant-current transistors having short L length.

BRIEF DESCRIPTION OF THE DRAWINGS

FIG. 2 is an output current characteristic diagram of a current cell type DA converter embodying the present invention.

FIG. 5 is a conceptual diagram illustrating an arrangement of current cells embodying the present invention in the current cell type DA converter shown in FIG. 3.

FIG. 6 is a conceptual diagram illustrating an arrangement of a current cell type DA converter and its output current characteristics embodying the present invention.

FIG. 11 is a conceptual diagram illustrating an example of a semiconductor chip which is loaded with a combination of analog and digital portions.

FIG. 12 is an exemplary diagram of a current cell type DA converter having variations in sloping output current characteristics.

FIGS. 13(a), (b) and (c) are exemplary diagrams illustrating the order in which current cells are turned on successively from one to the other end side; the order in which current cells are turned on alternately from the central portion to both end sides; and the order in which current cells are turned on at random.

FIGS. 14(a), (b) and (c) are output current characteristic diagrams in cases where current cells are turned on in the order shown in FIGS. 13(a), (b) and (c), respectively.

FIG. 15 is a conceptual diagram illustrating an arrangement of 3ch-DA converter and its output current characteristics.

DETAILED DESCRIPTION OF THE INVENTION

A detailed description will subsequently be given of a current cell type DA converter as the preferred embodiment of the present invention by reference to the accompanying drawings.

Figure 1:
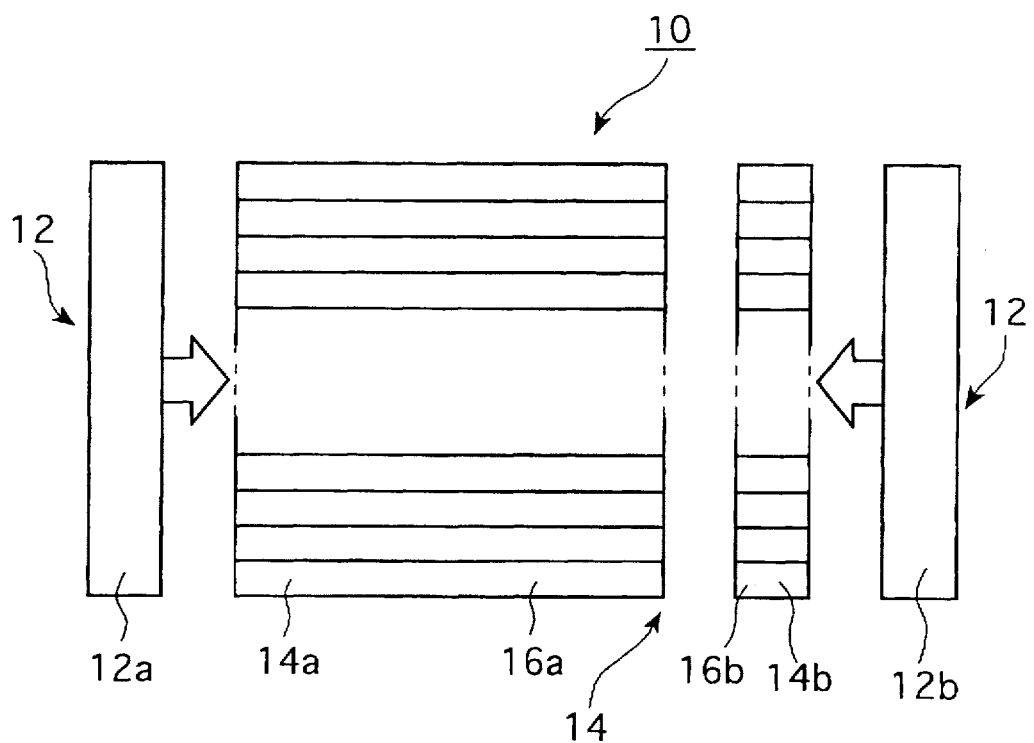
FIG. 1 is a block diagram of a current cell type DA converter according to one embodiment of the present invention.

FIG. 1 is a block diagram of a current cell type DA converter embodying the present invention. The current cell type DA converter 10 has a decoder 12 for decoding a digital signal and outputting the decoded signal, and a current cell block 14 in which a plurality of current cells corresponding to the resolution of an analog signal are arranged in a row. Moreover, a digital signal with a predetermined number of bits is supplied to the decoder 12 and a decoded signal that is output from the decoder 12 is supplied to the current cell block 14 from which an analog signal having resolution corresponding to the number of bits of the digital signal is output.

In this case, the decoder 12 is divided into two: a high order bit decoder 12a for decoding high order (na−1) bits out of high order na bits when, for example, a n-bit digital signal is formed with high order na bits and low order nb bits and outputting ($2^{na-1}-1$) of high order decoded signals; and a low order bit decoder 12b for decoding high order (nb−1) bits out of low order nb bits, for example, and outputting ($2^{nb-1}-1$) of low order decoded signals.

The current cell block 14 is divided into two: a high order bit current cell block 14a having ($2^{na-1}-1$) of high order bit current cells 16a capable of driving current equivalent to, for example, $2^{nb}$ LSB, to be precise, having one high order bit current cell 16a centrally positioned and ($2^{na-1}-1$) of a pair of high order bit current cells 16a, 16a symmetrically positioned on both sides of the one high order bit current cell 16a, out of the high order bit current cell blocks 14a arranged in a row; and a low order current cell block 14b having ($2^{nb-1}-1$) of low order bit current cells 16b capable of driving current equivalent to, for example, 1 LSB, to be precise likewise, having one low order bit current cell 16b centrally positioned and ($2^{nb-1}-1$) of a pair of low order bit current cells 16b, 16b symmetrically positioned on both sides of the one low order bit current cell 16a, out of the low order bit current cell blocks 14b arranged in a row.

In this case, ($2^{na-1}-1$) of high order decoded signals controls ($2^{na-1}-1$) of the pair of high order bit current cells 16a, 16a at a ratio of 1 to 1, whereas ($2^{nb-1}-1$) of low order decoded signals controls ($2^{nb-1}-1$) of the pair of low order bit current cells 16b, 16b at a ratio of 1 to 1 likewise.

Further, the one centrally positioned high order bit current cell 16a out of the high order bit current cell block 14a is directly controlled by the remaining low order 1 bit within the high order na bits which are not decoded by the high order bit decoder 12a, whereas the one centrally positioned low order bit current cell 16b out of the low order bit current cell block 14b is directly controlled by the remaining low order 1 bit within the low order nb bits which are not decoded by the low order bit decoder 12b likewise.

When this current cell type DA converter 10 is to convert an 8-bit decoded signal to an analog signal at 256 LSB resolution, for example, high order 3 bits out of the high order 4 bits of the digital signal are supplied to the high order bit decoder 12a; high order 3 bits out of the low order 4 bits are supplied to low order bit decoder 12b; seven high order decoded signals are output from the high order bit decoder 12a; and seven low order decoded signals are output from the low order bit decoder 12b.

Moreover, the high order bit current cell block 14a has 15 of high order bit current cells 16a capable of driving current equivalent to 16 LSB, to be precise, having one high order bit current cell 16a centrally positioned and seven pairs of high order bit current cells 16a, 16a symmetrically positioned on both sides of the one high order bit current cell 16a, out of the high order bit current cell blocks 14a arranged in a row; and the low order bit current cell block 14b has 15 of low order bit current cells 16b capable of driving current equivalent to 1 LSB, to be precise likewise, one low order bit current cell 16b centrally positioned and seven pairs of low order bit current cells 16b, 16b symmetrically positioned on both sides of the one low order bit current cell 16b, out of the low order bit current cell blocks 14b arranged in a row.

Thus the decoder 12 is divided into the high order bit decoder 12a and the low order bit decoder 12b and further the current cell block 14 is divided into the high order bit current cell block 14a and the low order bit current cell block 14b, whereby the circuit arrangement of the decoder 12 can be reduced in scale. Instead of generating 255 (=$2^8-1$) decoded signals by decoding an 8-bit digital signal, for example, it is only necessary to provide two circuits for generating seven (=$2^3-1$) decoded signals by decoding a 3-bit digital signal, so that the decoder 12 is formable with an extremely small circuit.

The current cell type DA converter 10 according to the present invention is formed by connecting all the current cells 16a, 16b to the output signal line 28 in parallel.

Incidentally, the current cell type DA converter 10 according to the present invention is provided as one relatively small functional block to be formed in a relatively large semiconductor chip and always situated in the end portion (peripheral portion) of the semiconductor chip. In a case where variations in output current characteristics occur between the current cells arranged in a row, the variations are necessarily sloping.

Figure 10A:
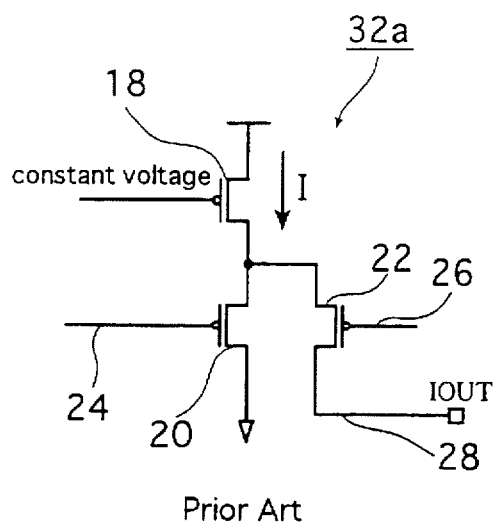
FIGS. 10(a), (b), (c) and (d) are circuit diagrams of conventional current cells.
Figure 10B:
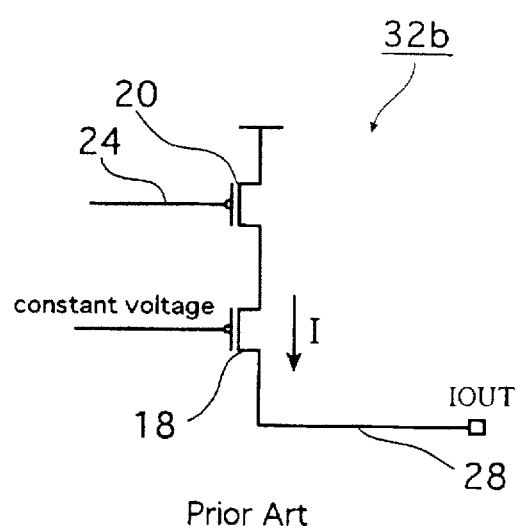
Figure 10C:
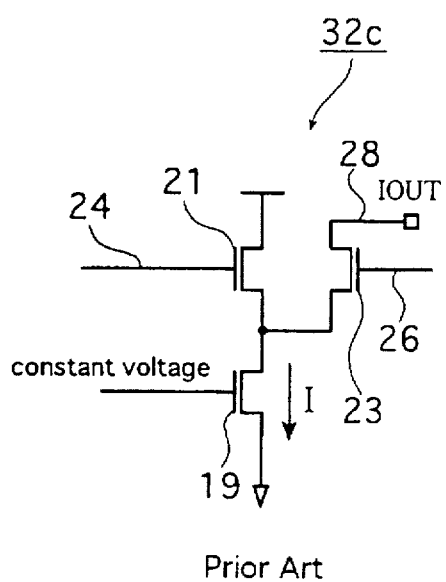
Figure 10D:
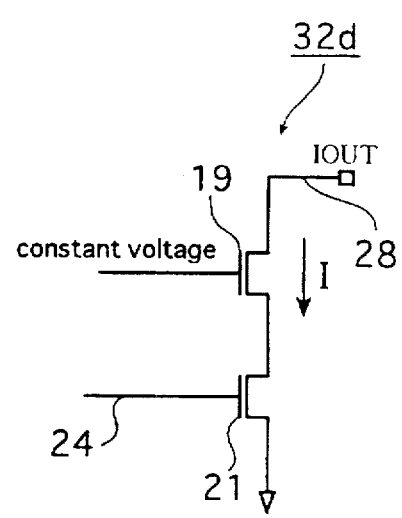

Moreover, the formation of the current cells 16a, 16b used according to the present invention is not restrictive and any other kind of conventionally known current cells in addition to those shown in FIGS. 10(a), (b), (c) and (d) may be employed. A description will be given of the formation of current cells 16a, 16b further on the assumption that they are similar to current cells 32a shown in FIG. 10(a).

The operation of the current cell type DA converter 10 thus arranged will subsequently be described.

When an n-bit digital signal is supplied to the current cell type DA converter 10, the high order na bits thereof are supplied to the high order bit decoder 12a and decoded so that ($2^{na-1}-1$) of high order decoded signals are supplied to the high order bit current cell block 14a. Similarly, the low order nb bits are supplied to the low order bit decoder 12b and decoded so that ($2^{nb-1}-1$) of low order decoded signals are supplied to the low order bit current cell block 14b.

Of these high and low order decoded signals, the same number of decoded signals as the high and low order bit values (digital codes) of the respective digital signals become active. In a case where a 4-bit digital signal whose digital code is 0100 (binary number) is input, for example, 15 (=$2^4-1$) decoded signals obtainable by decoding the input signal are output and of the 15 decoded signals, four decoded signals become active, that is, four current cells 16 are turned on.

When an active, that is, high-level (e.g., 5 V) decoded signal is supplied to the current cell 16 (see FIG. 10(a)), the PMOS 20 is completely held OFF, whereas the PMOS 22 is completely held ON. Since constant voltage is being applied to the gate of the PMOS 18, the constant current I of the PMOS 18 equivalent to 16 LSB for the high order bit current cell 16a and equivalent to 1 LSB for the low order bit current cell 16b is caused to flow via the PMOS 22 toward the output signal line 28.

When an inactive, that is, low-level (e.g., 0 V) decoded signal is supplied to the current cell 16, on the other hand, the PMOS 20 is completely held ON, whereas the PMOS 22 is completely held OFF. As a result, the constant current I of the PMOS 18 is caused to flow via the PMOS 22 toward the ground.

In the current cell block 14, only the current cell 16 (16a, 16b) corresponding to the active decoded signal is turned on like that and the total current that is output from the whole current cell 16 thus held ON is supplied to the output signal line 28. The current is converted by terminal resistance into a predetermined voltage level, though not shown, and it is output as an analog signal having a voltage level corresponding to the digital code thus applied.

Taking a case where a 3-bit digital signal is converted to an analog signal at 8 LSB resolution by way of example, there will subsequently be given a description of a method for controlling the current cell 16 as a subject featuring the current cell type DA converter 10 according to the present invention. As shown in FIG. 12, seven current cells 1, 2, 3, 4, 5, 6 and 7 are arranged in a row and out of them, the output current characteristic of the centrally positioned current cell 4 is ±0 and a description will be given on the assumption that sloping variations exist in the case of current cells 1–7.

FIG. 2 is an output current characteristic diagram of a current cell type DA converter embodying the present invention. In the output current characteristic diagram, the current cells in the ON state are marked with ○. Moreover, all the current cells 1-7 are in the OFF state when the digital code is 0 and the total of output current characteristics is naturally ±0.

As shown in the output current characteristic diagram, the current cell 4 is turned on, that is, only the current cell 4 with an output current characteristic of ±0 is turned on when the digital code is 1, so that the total of output current characteristics makes ±0.

When the digital code is 2, moreover, the current cell 4 is turned off and current cells 3 and 5 are simultaneously turned on, that is, the current cells 3 and 5 respectively with output current characteristics of +1 and −1 are simultaneously turned on, so that the total of output current characteristics makes +0 likewise.

While the current cells 3 and 5 remain in the ON state, the current cell 4 is turned on again when the digital code is 3, that is, the current cells 4, 3 and 5 respectively with output current characteristics of ±0, +1 and −1 are in the ON state, so that the total of output current characteristics makes ±0.

When the digital code is 4, further, the current cell 4 is turned off and while the current cells 3 and 5 remain in the ON state, the current cells 2 and 6 are simultaneously turned on again, that is, the current cells 3, 5, 2 and 6 respectively with output current characteristics of +1, −1, +2 and −2 are in the ON state, so that the total of output current characteristics makes ±0.

When the digital code is 5, further, the current cell 4 is turned on again while the current cells 3, 5, 2 and 6 remain in the ON state, that is, the current cells 4, 3, 5, 2 and 6 respectively with output current characteristics of ±0, +1, −1, +2 and −2 are in the ON state, so that the total of output current characteristics makes ±0.

When the digital code is 6, further, the current cell 4 is turned off again and while the current cells 3, 5, 2 and 6 remain in the ON state, the current cells 1 and 7 are simultaneously turned on, that is, the current cells 3, 5, 2, 6, 1 and 7 respectively with output current characteristics of +1, −1, +2, −2, +3 and −3 are in the ON state, so that the total of output current characteristics makes ±0.

When the digital code is 7, lastly, the current cell 4 is turned on again while the current cells 3, 5, 2, 6, 1 and 7 remain in the ON state, that is, the current cells 4, 3, 5, 2, 6, 1 and 7 respectively with output current characteristics of ±0, +1, −1, +2, −2, +3 and −3 are in the ON state, so that the total of output current characteristics makes ±0.

Thus in the current cell type DA converter 10 according to the present invention, the centrally-positioned current cell 4 of the current cell block 14 is turned on when the current cell is odd-numbered and turned off when the current cell is even-numbered. Moreover, the pair of current cells 3 and 5, that of current cells 2 and 6 and that of current cells 1 and 7 having similar output current characteristics on the plus and minus sides are simultaneously turned on or off in accordance with the values of the respective digital codes. In the current cell type DA converter 10 according to the present invention, variations in the output current characteristics can always be canceled completely, irrespective of the variation in the output current characteristics, which contributes to improving the linearity. Moreover, precision equal to what is given in the prior art can be compensated for from the standpoint of circuitry even when constant-current transistors having short L length are employed.

In the current cell type DA converter 10 shown in FIG. 1 in which the current cell block 14 is divided into the high and low order bit current cell blocks 14a, 14b, it is particularly effective to apply the method of controlling the current cell 16 used in such a current cell type DA converter 10 to the high order bit current cell block 14a since the current which is output from the one high order bit current cell 16a is large, that is, due to the presence of a wide variation in the output current characteristics; needless to say, however, it is most effective to apply that method to both the high and low order bit current cell blocks 14a, 14b.

In the current cell type DA converter 10 according to the present invention, moreover, switching the ON state of the centrally-positioned current cell 16 of the current cell block 14 to the OFF state is directly controllable with a 1-bit signal within the digital signal, though the above current cells 1-7 are controlled by the decoded signal from the decoder 12. Since the pair of current cells having the same output current characteristic on the plus and minus sides are so controllable that they are held ON and OFF simultaneously, that is, the pair of current cells are controllable with one decoded signal, the number of decoded signals for controlling them can be halved with the effect of making the decoder 12 quite simple in structure.

Figure 3:
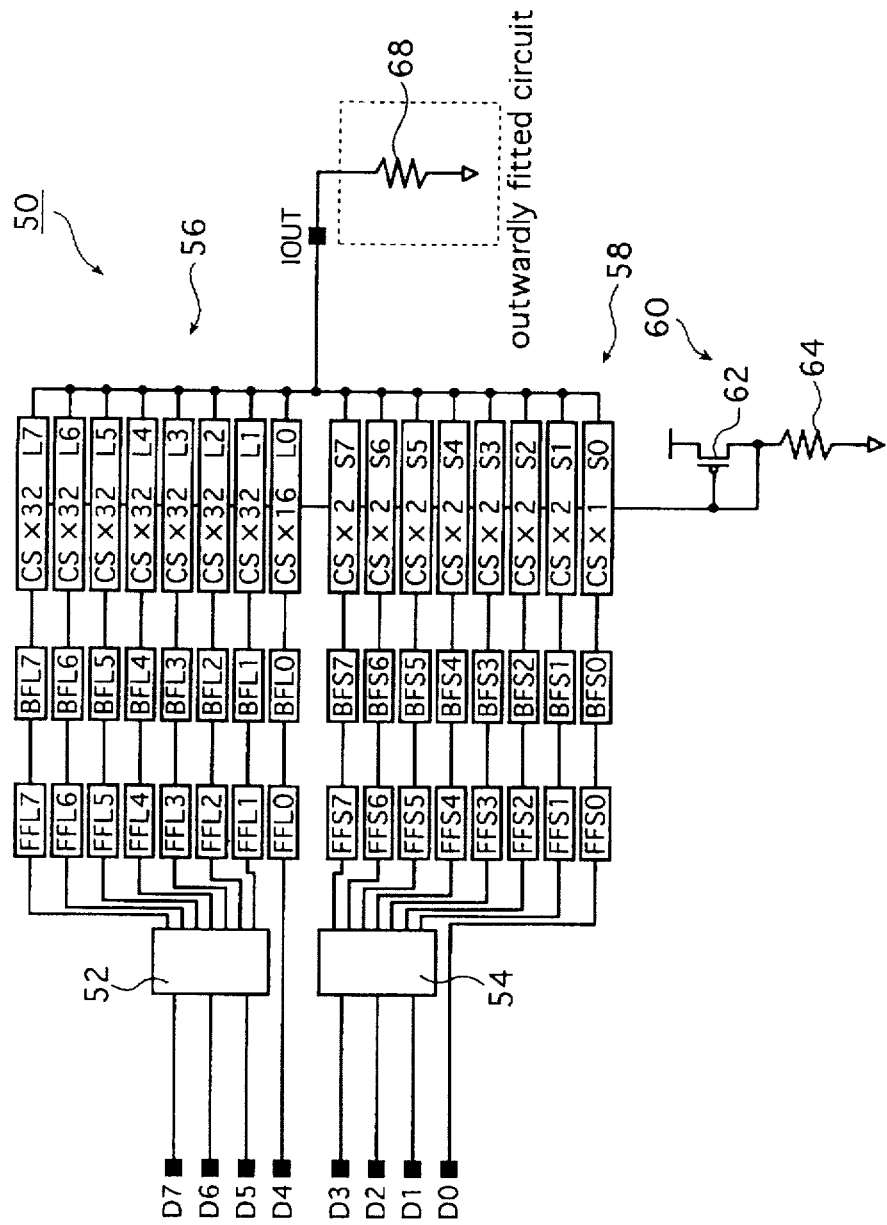
FIG. 3 is an overall conceptual diagram of a current cell type DA converter embodying the present invention.

FIG. 3 is an overall conceptual diagram of a current cell type DA converter embodying the present invention. A current cell type DA converter 50 as illustrated in FIG. 3 is designed to convert an 8-bit digital signal an analog signal at 256 LSB.

This current cell type DA converter 50 includes flip-flops FFL7–FFL0, FFS7–FFS0, timing regulating delay circuits BFL7–BFL0, BFS7–BFS0 and a constant-potential generating circuit 60.

A current cell L0 in FIG. 3 is a high order bit current cell (CS×16) for driving a 16 LSB current and current cells L7–L1 are high order bit current cell pairs (CS×32) formed by combining two high order bit current cells at 16 LSB for use in driving a 32 LSB current. The current cell L0 is directly controlled by a digital signal D4 and the current cell pairs L7–L1 are each controlled by common decoded signals; the same applies to current cells S7–S0.

Although the current cells L0 and S0 are directly controlled by the digital signals D4 and D0, the present invention is not limited to this exemplary case but may be applied to a case, for example, where the digital signals D4, D0 are each supplied to decoders 52, 54 and by directly outputting the digital signals from the decoders 52, 54, the current cells are each controlled directly by these decoded signals (i.e., decoded signals D4, D0).

The timing regulating delay circuits BFL7–BFL0, BFS7–BFS0 regulate the delay time of the outputs of the digital flip-flop FFL7–FFL0, FFS7–FFS0 and are each formed with a plurality of buffers connected in series, for example.

The constant-potential generating circuit 60 is used together with a resistance element 64 outwardly fitted to an output terminal IOUT to regulate output voltage at the output terminal IOUT and as shown in FIG. 3, has a PMOS 62 and the resistance element 64. The source of the PMOS 62 is connected to a power supply, whereas the gate and drain thereof are short-circuited and connected to the gate of the PMOS 18 (see FIG. 10(a)) as a constant-current source within the respective current cells L7–L0, S7–S0. Further, one terminal of the resistance element 64 is connected to the drain of the PMOS 62, whereas the other terminal is connected to the ground.

Figure 4:
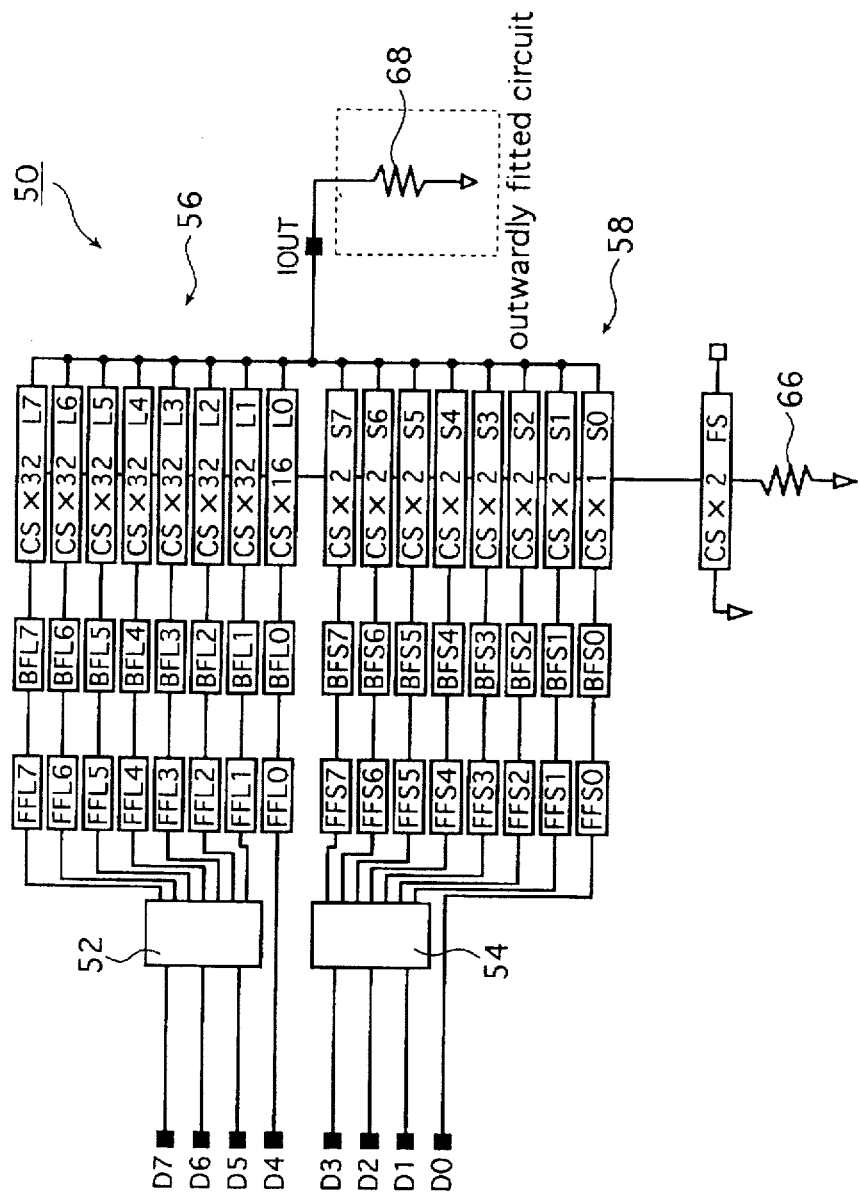
FIG. 4 is an overall conceptual diagram of another current cell type DA converter embodying the present invention.

As shown in FIG. 4, an adjusting current cell FS as a regulating current cell for determining a current value equivalent to one current cell, in place of the constant-potential generating circuit 60, may be employed. The quantity of current that is output from the adjusting current cell FS is determined according to the resistance value of an external resistance element 66. At this time, the quantity of current output from the adjusting current cell FS divided by the number of current cells is equal to the quantity of current per current cell. Thus the quantity of current per current cell is determined.

Incidentally, use of at least two of the adjusting current cells FS is preferred in consideration of symmetrical arrangement.

In this DA converter 50, the digital signals D7–D5 out of the digital signals D7–D0 are supplied to the high order bit decoder 52 and the digital signals D3–D1 to the low order bit decoder 54 likewise.

The high order decoded signals that are output from the high order bit decoder 52 and the digital signal D4 are each latched by the flip-flops FFL7–FFL0 and then supplied via the timing regulating delay circuits BFL7–BFL0 to a high order bit current cell block 56. The low order decoded signals that are output from the low order bit decoder 54 and the digital signal D0 are each latched by the flip-flops FFS7–FFS0 and then supplied via the timing regulating delay circuits BFS7–BFS0 to a low order bit current cell block 58.

FIG. 5 shows an exemplary layout of high and low order bit current cells. As shown in FIG. 5, the high order bit current cells L7–L0 are such that the current cell L0 is centrally positioned, whereas the current cell pairs L1–L7 are arranged in both symmetrical positions. Further, the low order bit current cells S7–S0 are vertically arranged in the central position with respect to the lateral high order bit current cells. The current cell S0 is centrally positioned, whereas the low order bit current cell pairs S7–S0 are arranged in both symmetrical positions.

The low order bit current cells S7–S1 are centrally positioned with respect to the high order bit current cells L7–L0 like this and the advantage of the above arrangement is that deviation can be minimized at the time of carrying from the low order bit.

An example of calculating full scale voltage (the maximum output voltage) will be shown below.

Where IA is quantity of current flowing through the resistance element 64 of the constant-potential circuit 60, RΩ is resistance value of the resistance element 68 outwardly fitted to the output terminal IOUT, the full scale current is given by Ix255            [A].

The full voltage is also given by

255×IR            [V], because of the resistance RΩ of the output terminal IOUT.

When the centrally-positioned current cell 16 of the current cell block 14 is turned off simultaneously when one set of current cell pair having the same output current characteristic on both the plus and minus sides are turned off, a gridge is expected to appear in the output signal line 28. In the case of the current cell type DA converter 10, however, it is a phenomenon similar to what is associated with a case where the high order bit current cell block 14a is turned on to reflect the carries created in the low order bit current cell block 14b and the generation of the gridge can completely be suppressed by, for example, latching the output signal of the decoder, that is, inserting a latch and/or a timing regulating delay circuit in the preceding stage of the decode signal line 24.

Figure 9:
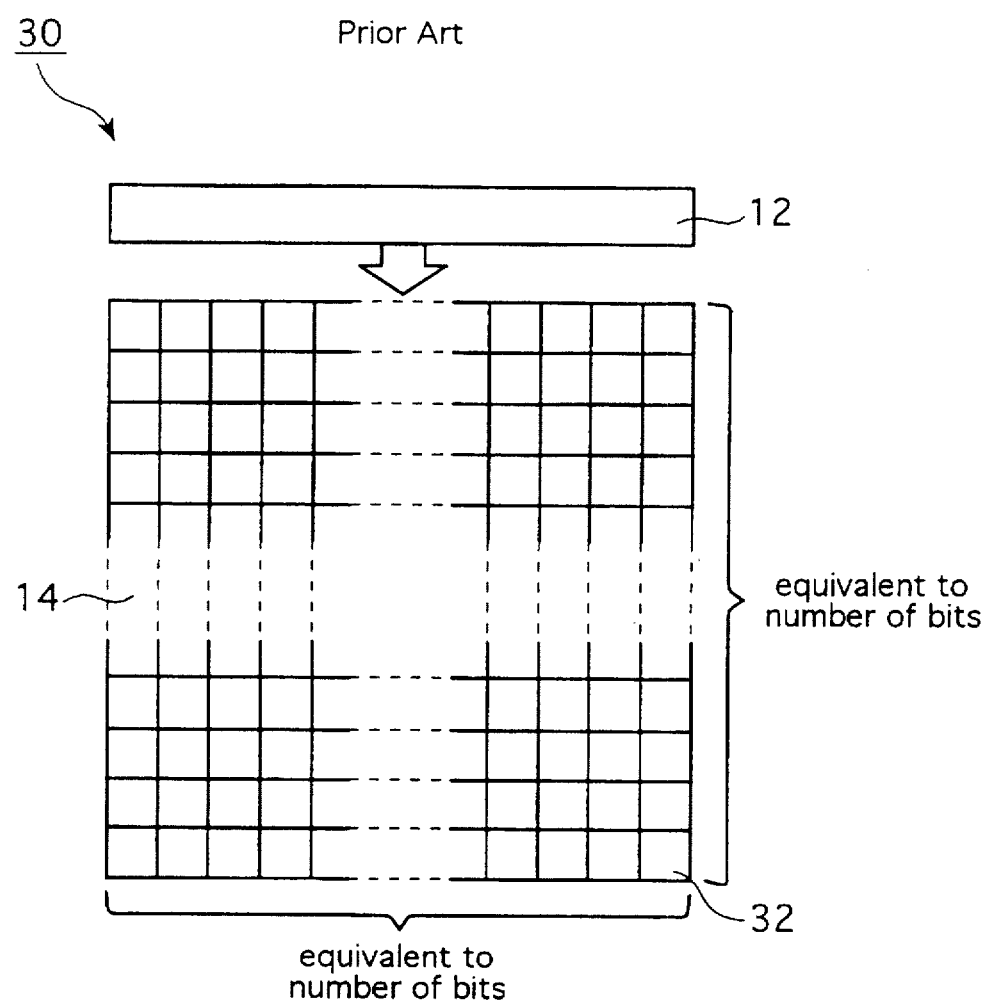
FIG. 9 is a block diagram illustrating an example of a conventional current cell type DA converter.

Although the current cell type DA converter 10 according to the present invention is basically arranged as stated above, the present invention is not limited to the aforesaid embodiment thereof but may be modified properly. For example, not only the current cell block 14 which is divided into two for high and low order bits as shown in FIG. 1 but also what is not divided as shown in FIG. 9 may also be applicable according to the present invention. Further, any known circuit arrangement may be used for that of the current cell 16 and when the current cell 32a, 32b, 32c or 32d shown in FIG. 10(a), (b), (c), (d) is used, it is preferred to properly select the fixed voltage applied to the gate of the PMOS 18 or the NMOS 19.

In FIG. 2, further, though the current cell pair 3 and 5 are simultaneously turned on when the digital code is 2; the current cell pair 2 and 6 are simultaneously turned on when the digital code is 4; and further the current cell pair 1 and 7 are simultaneously turned on when the digital code is 6, the order in which these current cell pairs are turned on is not restrictive. For example, that order may properly be altered in such a way that the current cell pair 2 and 6, the current cell pair 1 and 7 and the current cell pair 3 and 5 are simultaneously turned on when the digital codes are 2, 4 and 6, respectively.

Taking a case where a 3ch-DA converter for converting a 3-bit digital signal to an analog signal at 8 LSB, that is, for use in image signal processing by way of example, there will subsequently be given a description of the DA converter which has a plurality of channels and is reduced to the macro cell as an application of the current cell type DA converter according to the present invention.

FIG. 6 is a conceptual diagram illustrating an arrangement of a current cell type DA converter and its output current characteristics as an application of the present invention.

In FIG. 6, variations in the channel-to-channel output current characteristics of the DA converter are displayed on a current cell basis and variations in the cell-to-cell output current characteristics of the DA converter in the respective channels are also displayed in parentheses on a current cell basis likewise.

The 3ch-DA converter shown in FIG. 6 is formed with a mixture of current cells R1–R7 of R color, current cells G1–G7 of G color and current cells B1–B7 of B color laid out in a row. The current cell B4 is centrally positioned and with the current cell B4 as the central element, the current cells G4a, G4b and similarly the current cells R4a, R4b are each positioned on both symmetrical sides.

In this case, the current cells G4a, G4b are formed, for example, by dividing the size of a transistor constituting the original current cell G4 into two blocks, each vertically having not only ½ driving capability but also a ½ height of the current cell G4. The current cells G4a, G4b are turned on or off by means of the same decoded signal and when they are turned on, the same quantity of current in total as the current intended for the current cell G4 before it is thus divided is made to flow through both of them. The same exactly applies to the current cells R4a, R4b.

With the current cell B4 as the central element, the current cells B5, B3 are disposed on both symmetrical sides of the current cells R4a, R4b and so forth; namely, with the current cell B4 as the central element, the current cells G5, G3, the current cells R5, R3, the current cells B6, B2, the current cells G6, G2, the current cells R6, R2, the current cells B7, B1, the current cells G7, G1 and the current cells R7, R1 are disposed on both symmetrical sides.

In other words, in the DA converter having the plurality of channels according to the present invention, the central current cell of the DA converter in any one of the channels (meaning the centrally-positioned current cell when the current cells of each DA converter of the individual channel are arranged in a row) out of the DA converters in the plurality of channels is centrally positioned. On the other hand, each of the central current cells of the DA converters in the remaining channels is divided into two current cells, which are each disposed on both symmetrical sides of the centrally-positioned current cell; to be precise according to this embodiment of the invention, the current cells resulting from such division are successively disposed at the respective linear symmetrical positions centering on the current cell B4. Then the pair of current cells centering on the central current cell of the DA converter of the individual channel are positioned on both sides thereof.

In the 3ch-DA converter shown in FIG. 6, consequently, the DA converter current cell pairs are symmetrically positioned on the whole with the centrally-positioned current cell B4 as the central element. Therefore, the total of output current characteristics of the individual DA converter can always be kept at ±0 by controlling the individual DA converter as shown in FIG. 2, whereby variation in the output current characteristic of the individual DA converter can completely be canceled, irrespective of the number of channels of the DA converter and the digital code, and channel-to-channel variations in the output current characteristics can also be obviated.

In the example shown in FIG. 6, the 3ch-DA converter has been used by way of example to illustrate the current cell pairs arranged successively in the order of B color, G color and R color. However, the present invention is not limited to this exemplary case.

Although the current cell B4 of the DA converter of B color is centrally positioned, for example, according to this embodiment of the invention, the current cell G4 of the DA converter of G color or the current cell R4 of the DA converter of R color may be centrally positioned instead.

Although the current cells of R, G, B colors in the example shown in FIG. 6, moreover, are adjacently, successively and symmetrically arranged about the centrally-positioned current cell, the present invention is not limited to this example but also applicable to a case where current cells of the same color are adjacently disposed as long as symmetry is maintained.

Further, the present invention is not limited to such a 3ch-DA converter in application but also applicable to any kind of DA converter having a plurality of channels.

Figure 7:
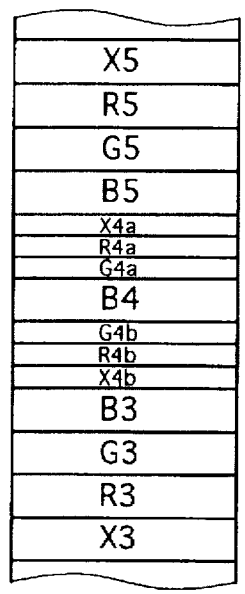
FIG. 7 is a conceptual diagram illustrating another arrangement of a current cell type DA converter embodying the present invention.

FIG. 7 is a conceptual diagram illustrating another embodiment of the present invention applied to a 4ch-DA converter together with an arrangement of current cells of such a DA converter in an individual channel.

Like the 3ch-DA converter shown in FIG. 6, the 4ch-DA converter shown by way of example has additional current cells X1–X7 of a DA converter of X in the fourth channel and with the current cell B4 as the central element, current cell pairs X4a, X4b; X5, X3; X6, X2; X7, X1 are successively arranged on both symmetrical sides of current cells R4a, R4b; R5, R3; R6, R2; R7, R1 of a DA converter of R. Incidentally, the current cell X4 has been divided into two current cells X4a, X4b likewise.

Moreover, a plurality of current cell pieces having less driving capability may be used to form each of the current cells which are formed in pairs and disposed at linear symmetrical positions with respect to the centrally-positioned current cell.

Thus the present invention is not limited to such a DA converter as is supplied with a specific number of channels but may also be applicable to what has any number of channels.

It has been so arranged according to the aforesaid embodiment of the present invention that when the centrally-positioned current cell of the DA converter in each channel is situated according to the present invention, each of the current cells G4, R4 other than the centrally-positioned current cell B4 is divided into two and current cells G4a, G4b an R4a, R4b resulting form such division are disposed on both symmetrical sides of the centrally-positioned current cell B4. However, the present invention is not limited to this exemplary case.

Figure 8:
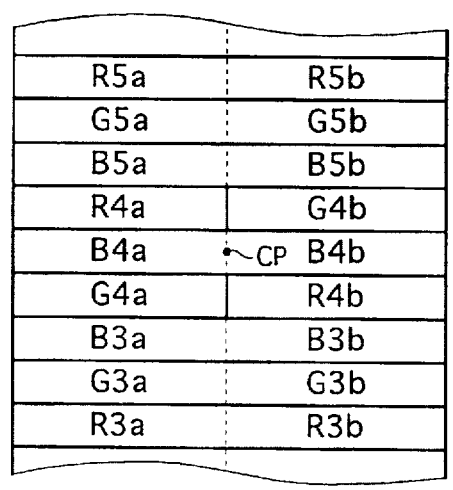
FIG. 8 is a conceptual diagram illustrating still another arrangement of a current cell type DA converter embodying the present invention.

FIG. 8, for example, is a conceptual diagram illustrating sill another embodiment of the present invention applied to a 3ch-DA converter together with an arrangement of current cells of such a DA converter in an individual channel.

The 3ch-DA converter shown by way of example is characterized in that current cells other than the current cells G4a, G4b and R4a, R4b are halved in vertical height and that those current cells are laterally doubled in width when compared with the 3ch-DA converter shown in FIG. 6, that is, R3, for example, is considered as what is divided into R3a and R3b and with the central position of the current cells B4a and B4b as a center point CP, the current cells G4a, G4b and R4a, R4b are disposed at the respective symmetrical positions. Therefore, the 3ch-DA converter is considered to be inclusive of a row of current cells R3a, G3a, B3a, G4a, B4a, R4a, B5a, G5a, R5a, . . . and another row of current cells R3b, G3b, B3b, R4b, B4b, G4b, B5b, G5b, R5b, . . . ; two rows in total.

In the DA converter of FIG. 8, as viewed from a different angle, its width remains unchanged, that is, each of the current cells other than those of G4a, G4b and R4a, R4b remain exactly the same in width (i.e., the external shape of the DA converter remains unchanged) and consequently the DA converter is considered as what has the current cells G4a, G4b and R4a, R4b, whose width has been reduced to ½ (i.e., their height is doubled) except for its arrangement.

Since the current cells G4a, G4b, in the DA converter are disposed in point symmetry about the central point CP, variation in the output current characteristics in both lateral and vertical directions are completely canceled, so that the precision of the DA converter is improvable. As is obvious from this embodiment of the invention, moreover, the external shape is changeable as desired as the width and height of the DA converter can be increased and decreased, respectively.

Although, the current cells are arranged in two rows outwardly in the example shown, the present invention is not limited to that exemplary case but may be modified in that current cells are disposed in a plurality of rows as far as a pair of current cells of the same color to be centrally positioned are arranged in point symmetry. Moreover, current cells to be centrally position in point symmetry may be divided further into current cell pieces having less current driving capability.

As set forth above in detail, the current cell type DA converter according to the present invention is used as part of a semiconductor chip and placed in the end portion of the semiconductor chip and consequently it causes variation in the sloping output current characteristic. In the current cell type DA converter according to the present invention, moreover, the centrally-positioned current cell out of the current cells arranged in a row is turned on when the digital signal is odd-numbered and conversely turn off when it is even-numbered. Then the current cell pairs disposed on both symmetrical sides of the centrally-positioned current cell are turned on or off, depending on the digital signal.

Further, the current cell type DA converter according to the present invention is also applicable to what has a plurality of channels and the current cells of the individual DA converter are disposed on both symmetrical sides of the centrally-positioned current cell.

In the current cell type DA converter according to the present invention, the output current characteristic of the centrally-positioned current cell is ±0 in either case of a single channel or multiple channels since the output current characteristics of the current cell pairs symmetrically arranged are offset when these current cells are simultaneously turned on. Thus variations in the respective channel-to-channel output current characteristics, to say nothing of the output current characteristic within the channel, can be canceled, so that a level of ±0 is always maintained as sloping variations in the whole output current characteristic are completely canceled. Therefore, with the current cell type DA converter according to the present invention, the linearity and precision of the output current characteristics are improvable. Moreover, the current cell type DA converter according to the present invention has the effect of compensating for precision equal to what is given in the prior art from the standpoint of circuitry even when constant-current transistors having short L length are employed and preventing the yield from lowering because of variations in processing.

What is claimed is:

1. A current cell type digital-analog converter which is situated in an end portion of a semiconductor chip and adapted to outputting an analog signal having resolution corresponding to the number of bits of an input digital signal, the current cell type digital-analog converter comprising:

a decoder for decoding the digital signal and outputting a decoded signal, and a current cell block in which a plurality of current cells corresponding to the resolution of the analog signal are arranged in a row and each of the current cells is controlled by the decoded signal, and at least two adjusting current cells for regulating the quantity of current driven by the current cells, wherein:
the centrally-positioned current cell out of those arranged in a row is turned on when the digital signal is odd-numbered and turned off when the digital signal is even-numbered; and
with the centrally-positioned current cell as the central element, current cell pairs disposed on both symmetrical sides of the centrally-positioned current cell are simultaneously turned on or off on a current cell pair basis according to the digital signal.

2. A current cell type digital-analog converter as claimed in claim 1, wherein the current cell has a constant-current source for driving a predetermined current, and a first and a second switching element for switching the predetermined current driven by the constant-current source to an output terminator the ground so as to output the predetermined current, wherein the control terminals of the first and second switching elements are exclusively controlled in accordance with the value of the digital signal.

3. A current cell type digital-analog converter as claimed in claim 2, further comprising a latch for holding a signal supplied to the control terminals of the first and second switching elements.

4. A current cell type digital-analog converter as claimed in claim 1, wherein the at least two adjusting current cells are disposed in the vertically and horizontally symmetrical sides of the centrally-positioned current cell.

5. A current cell type digital-analog converter as claimed in claim 1, wherein the centrally-positioned current cell out of those arranged in a row is directly controlled by the decoded signal using one bit within the digital signal; and with the centrally-positioned current cell as the central element, the current cell pairs disposed on both symmetrical sides of the centrally-positioned current cell are simultaneously controlled on a current cell pair basis by the decoded signal which is output from the decoder.

6. A current cell type digital-analog converter as claimed in claim 1, wherein the decoder is divided into two: a high order bit decoder for decoding the high order bits of the digital signal and outputting a high order decoded signal, and a low order bit decoder for decoding the low order bits of the digital signal and outputting a low order decoded signal; and the current cell block is divided into two: a high order bit current cell block in which high order bit current cells for driving the current corresponding to the high order bit are arranged in a row, and a low order bit current cell block in which low order bit current cells for driving the current corresponding to the low order bit are arranged in a row.

7. A current cell type digital-analog converter as claimed in claim 6, wherein the low order bit current cell block is placed in the center of the high order bit current cell block.

8. A current cell type digital-analog converter which is situated in an end portion of a semiconductor chip and has a plurality of channels each of which is used for outputting an analog signal having resolution corresponding to the number of bits of an input digital signal, the current cell type digital-analog converter comprising:

a decoder for decoding the digital signal so as to output a decoded signal on a channel basis, and a current cell block in which a plurality of current cells having desired driving capability corresponding to the resolution of the analog signal in each channel are arranged in a row or rows with respect to the plurality of channels and arranged symmetrically with respect to the centrally-positioned current cell, the current cell in each channel being controlled by the decoded signal in each channel, wherein with respect to one channel out of the plurality of channels, one of the current cells arranged in a row or rows is centrally positioned, the remaining current cells being arranged symmetrically with respect to the centrally-positioned current cell;

with respect to the remaining channels, two current cells as a pair of current cells having half the driving capability of the centrally-positioned current cell are arranged symmetrically about the centrally-positioned current cell, and the remaining cells have the same driving capability as that of the centrally-positioned current cell are arranged symmetrically about the centrally-positioned current cell and the pair of centrally-positioned current cells in each channel and wherein with respect to each of the whole plurality of channels, the centrally-positioned current cell out of those arranged in a row or rows or the pair of centrally-positioned current cells are turned on when the digital signal is odd-numbered and turned off when the digital signal is even-numbered;

with the centrally-positioned current cell as central element and with the pair of centrally-positioned current cells as the central elements, current cell pairs arranged on both symmetrical sides outside the centrally-positioned current cell or the pair of centrally-positioned current cells are simultaneously turned on or off according to the digital signal on the basis of the current cells thus symmetrically arranged.

9. A current cell type digital-analog converter as claimed in claim 8, wherein with respect to each channel, the pair of centrally-positioned current cells are arranged in linear symmetry about the centrally-positioned current cell.

10. A current cell type digital-analog converter as claimed in claim 9, wherein each of the pair of centrally-positioned current cells has the same width as that of the centrally-positioned current cell and half the height thereof.

11. A current cell type digital-analog converter as claimed in claim 10, wherein each of the pair of centrally-positioned current cells has the same number of transistors as that of those constituting the centrally-positioned current cell, whereas the size of such a transistor is halved.

12. A current cell type digital-analog converter as claimed in claim 9, wherein each of the pair of centrally-positioned current cells is formed of a plurality of current cell pieces, which are arranged in linear symmetry about the centrally-positioned current cell.

13. A current cell type digital-analog converter as claimed in claim 8, wherein the pair of centrally-positioned current cells are, with respect of each channel, arranged in point symmetry about the center of the centrally-positioned current cell.

14. A current cell type digital-analog converter as claimed in claim 13, wherein the centrally-positioned current cell and each of the current cell pair thus symmetrically arranged have the same height as that of each of the pair of centrally-positioned current cells and have width twice as large as each of the pair of centrally-positioned current cells.

15. A current cell type digital-analog converter as claimed in claim 13, wherein each of the pair of centrally-positioned current cells is formed of a plurality of current cell pieces, which are arranged in point symmetry about the center of the centrally- positioned current cell.

16. A current cell type digital-analog converter as claimed in claim 8, wherein the current cell has a constant-current source for driving a predetermined current, and a first and a second switching element for switching the predetermined current driven by the constant-current source to an output terminal or the ground so as to output the predetermined current, wherein the control terminals of the first and second switching elements are exclusively controlled in accordance with the value of the digital signal.

17. A current cell type digital-analog converter as claimed in claim 16, further comprising a latch for holding a signal supplied to the control terminals of the first and second switching elements.

18. A current cell type digital-analog converter as claimed in claim 8, further comprising at least two adjusting current cells for regulating the quantity of current driven by the current cell.

19. A current cell type digital-analog converter as claimed in claim 8, wherein the centrally-positioned current cell and the pair of centrally-positioned current cells in each channel are directly controlled by the decoded signal using one bit within the digital signal in the corresponding channel; and the centrally-positioned current cell or the current cell pairs disposed on both symmetrical sides outside the pair of the centrally-positioned current cells are simultaneously controlled on the basis of the current cell pair thus symmetrically arranged by the decoded signal which is output from the decoder.

20. A current cell type DA converter as claimed in claim 8, wherein the decoder is divided into two: a high order bit decoder for decoding the high order bits of the digital signal and outputting a high order decoded signal, and a low order bit decoder for decoding the low order bits of the digital signal and outputting a low order decoded signal; and the current cell block is divided into two: a high order bit current cell block in which high order bit current cells for driving the current corresponding to the high order bit are arranged in a row or rows, and a low order bit current cell block in which low order bit current cells for driving the current corresponding to the low order bit are arranged in a row or rows.

21. A current cell type digital-analog converter as claimed in claim 20, wherein the low order bit current cell block is placed in the center of the high order bit current cell block.

22. A current cell type digital-analog converter as claimed in claim 18, wherein the at least two adjusting current cells are disposed in the vertically and horizontally symmetrical sides of the centrally-positioned current cell.

* * * * *

UNITED STATES PATENT AND TRADEMARK OFFICE
CERTIFICATE OF CORRECTION

PATENT NO. : 5,760,725
DATED : June 2, 1998
INVENTOR(S) : Sinya YOSHIDA and Toyohisa MATSUKAWA It is certified that error appears in the above-identified patent and that said Letters Patent is hereby corrected as shown below:

Column 22, line 28, change "DA" to --digital-analog--.

Signed and Sealed this

Second Day of March, 1999

Attest:

Q. TODD DICKINSON

*Attesting Officer*   *Acting Commissioner of Patents and Trademarks*